(12) United States Patent
Fryers et al.

(10) Patent No.: US 6,330,154 B1
(45) Date of Patent: Dec. 11, 2001

(54) COOLING EQUIPMENT

(75) Inventors: Bruce Fryers, Leighton Buzzard; Gerard MacManus, Lower Woodside; Michael Tate, Watford; Nicholas Foley, Musselburgh, all of (GB)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/311,319

(22) Filed: May 13, 1999

(30) Foreign Application Priority Data

Feb. 2, 1999 (GB) .................................................. 9902327

(51) Int. Cl.$^7$ .................................................. H65K 7/20
(52) U.S. Cl. .................................................. 361/695; 454/184
(58) Field of Search .................................................. 361/687, 680, 361/694–695; 454/184, 353; 165/80.3

(56) References Cited

U.S. PATENT DOCUMENTS

| | | | |
|---|---|---|---|
| 4,103,737 | 8/1978 | Perkins | 165/80 |
| 4,616,693 | 10/1986 | Dietzsch et al. | 165/41 |
| 4,644,443 | 2/1987 | Swenson et al. | 361/384 |
| 4,765,397 | 8/1988 | Chrysler et al. | 165/104.33 |
| 4,851,965 | 7/1989 | Gabuzda et al. | 361/383 |
| 4,860,163 | 8/1989 | Sarath | 361/384 |
| 5,002,123 | 3/1991 | Nelson et al. | 165/147 |
| 5,304,846 | 4/1994 | Azar et al. | 257/722 |
| 5,338,214 * | 8/1994 | Steffes et al. | 361/695 |
| 5,361,188 | 11/1994 | Kondou et al. | 361/695 |
| 5,437,328 | 8/1995 | Simons | 165/146 |
| 5,523,917 * | 6/1996 | Searby | 361/687 |
| 5,606,201 | 2/1997 | Lutz | 257/714 |
| 5,689,403 | 11/1997 | Robertson, Jr. et al. | 361/695 |
| 5,707,282 * | 1/1998 | Clements et al. | 454/184 |
| 5,731,953 | 3/1998 | Sakurai | 361/695 |
| 5,860,472 | 1/1999 | Batchelder | 165/185 |
| 5,914,857 | 6/1999 | Johnson et al. | 361/690 |
| 5,953,209 | 9/1999 | Chiu | 361/697 |
| 5,957,194 | 9/1999 | Azar | 165/80.3 |
| 5,969,950 | 10/1999 | Tantoush | 361/704 |
| 5,978,217 * | 11/1999 | Kerrigan et al. | 361/694 |
| 6,064,571 * | 5/2000 | Noble | 361/695 |
| 6,084,770 | 7/2000 | Wyland | 361/692 |
| 6,089,315 | 7/2000 | Lee et al. | 165/185 |
| 6,094,345 * | 7/2000 | Diemunsch | 361/369 |

FOREIGN PATENT DOCUMENTS

| | | |
|---|---|---|
| 0 034 223 | 3/1980 | (EP) . |
| 0 145 311 | 11/1984 | (EP) . |
| 0 458 500 | 5/1991 | (EP) . |
| 0 463 783 | 6/1991 | (EP) . |
| 0 563 755 | 3/1993 | (EP) . |
| 0 910 235 | 4/1999 | (EP) . |
| 2 605 685 | 10/1986 | (FR) . |
| 2 280 989 | 2/1995 | (GB) . |
| 1 018 623 | 1/1996 | (GB) . |
| 2 296 132 | 6/1996 | (GB) . |
| 2 202 681 | 9/1998 | (GB) . |
| WO 93/06340 | 4/1993 | (WO) . |
| WO 97/38566 | 10/1997 | (WO) . |
| WO 99/14807 | 3/1999 | (WO) . |

\* cited by examiner

*Primary Examiner*—Gregory Thompson
(74) *Attorney, Agent, or Firm*—Michaelson & Wallace; Peter L. Michaelson; Janet M. Skafar

(57) ABSTRACT

Cooling apparatus is used to cool equipment, for example electrical equipment, using a fan. In an embodiment described, the cooling apparatus comprises a duct for communication with the fan and for transporting air past the equipment. The duct may include a diffuser for improving the air flow in the duct.

24 Claims, 9 Drawing Sheets

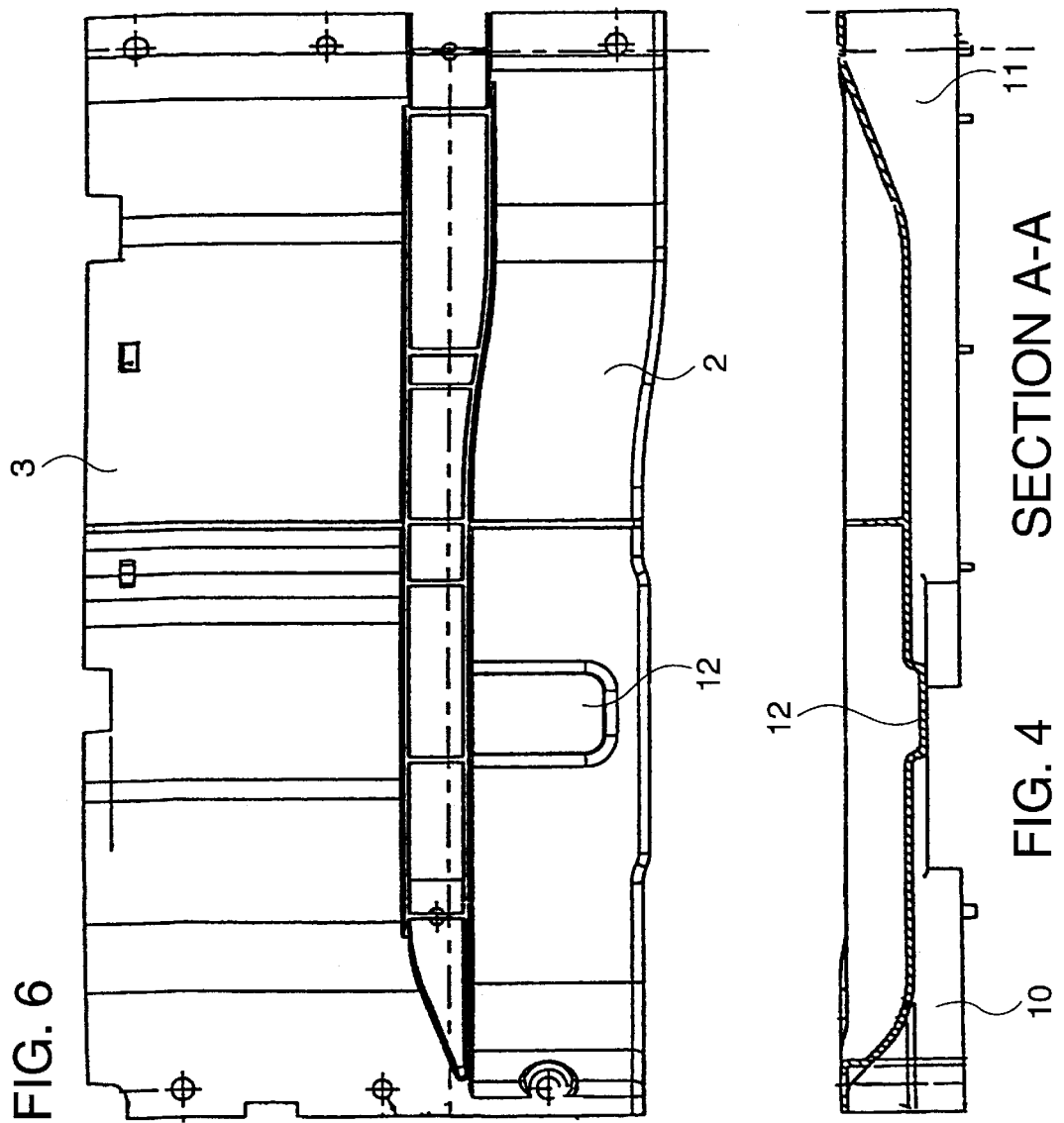

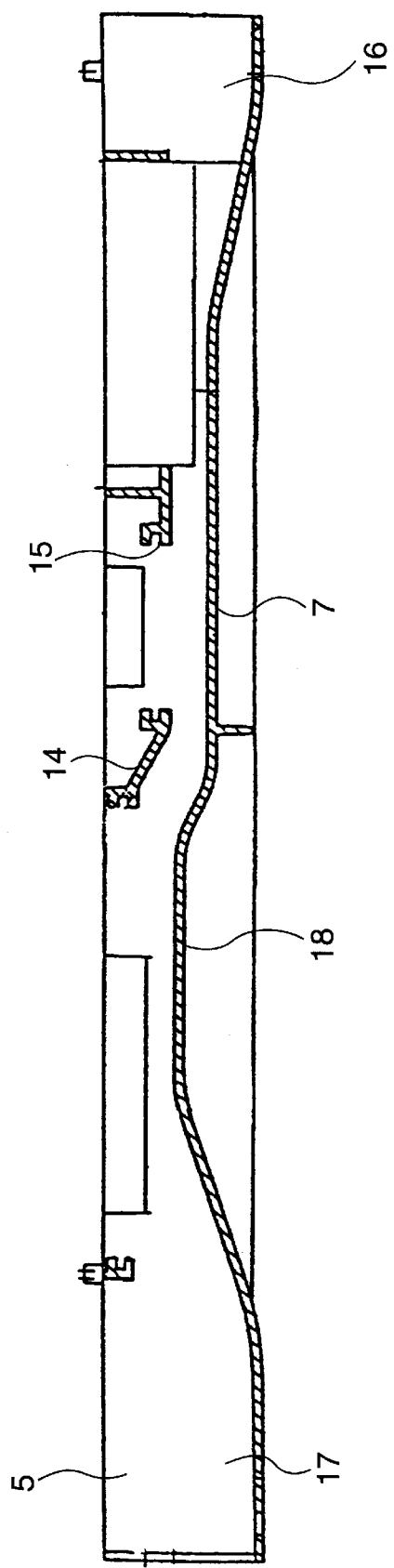

COOLING EQUIPMENT

The present invention relates to cooling apparatus, in particular, but not exclusively, cooling apparatus for cooling electrical or other equipment. The invention further relates to an electrical device comprising the cooling apparatus, and a method of cooling equipment.

The invention relates more particularly to electrical equipment which performs a processing or memory function, such as any processor (for example a semiconductor or other logic device, an integrated circuit, a microprocessor and the like) or any storage device (for example a mass storage device). Such equipment may be in the form of an integrated circuit, possibly mounted on a printed circuit board. Accordingly, the electrical device may typically be a computer, modem, switch, hub or like device.

An electrical device such as a computer includes various items of electrical equipment which generate heat during use. During use, such equipment becomes warm. It is undesirable for the equipment to become too hot because excessive heat can cause damage to components of the equipment. It is known to cool electrical equipment using one or more fans and indeed a cooling fan is often provided in electrical devices. In a conventional arrangement, electrical equipment is arranged within a casing. The fan sucks air through one or more vents in the casing, the air passes over the equipment and out of the casing via the fan.

However, under many conditions, such fans have been found to be inefficient.

Furthermore, it has been realised pursuant to the present invention that, in many situations, some of the items of electrical equipment in the device require more cooling than other equipment. In order to cool such equipment sufficiently, a high air flow through the equipment is required. Other equipment which requires little or no cooling is also subject to the high air flow unnecessarily.

The present invention seeks to mitigate one or more of the above-mentioned problems and/or other problems.

According to the present invention, there is provided a cooling apparatus for cooling electrical equipment using a fan, the apparatus comprising a duct for communication with the fan and for transporting air past the equipment, the duct including a diffuser.

As used herein, it should be understood that the term "duct" should be interpreted broadly to include any passage or channel along which air flow may be directed. The term is not restricted to fully enclosed structures (as for example a tube), but also includes for example structures which are not fully enclosed, and yet have the flow directing features of a duct. It includes structures which, with the addition of say a wall of the device in which the duct may be located, constitute fully enclosed structures. Considering a duct having a generally rectangular section, for example, the air flow might be enclosed only on three sides or on two sides: the duct may comprise three surfaces or only two surfaces. It is envisaged that the duct may only comprise a single surface but that surface may serve to effect the desired air flow.

By providing a cooling apparatus with a duct, the flow of air can be arranged so that it passes directly past the equipment to be cooled. Furthermore, the flow of air directly adjacent the equipment may be more easily controlled. Thus the efficiency of the cooling apparatus may be increased. By using a duct for the transport of the air, the equipment to be cooled by the cooling apparatus may also be remote from the fan.

Preferably, the diffuser is arranged adjacent the downstream end of the duct. In arrangements in which air is sucked through the duct and into a fan, the diffuser is advantageously arranged immediately upstream of the fan. The diffuser is a passage which gradually increases in sectional area downstream and its function is to reduce the velocity of flow of the air while preserving its total head as much as possible.

The use of a diffuser is particularly advantageous in arrangements where the diffuser is provided directly upstream from the fan. The efficiency of the fan can be maximised by arranging for the velocity of the air at the fan to be in the most desirable range for its operation. The most desirable velocity of the air flow at the fan will usually be below that of the most desirable velocity for the cooling of the electrical equipment. Thus, by using the diffuser, a high velocity of air can be maintained upstream of the fan while not sacrificing too much the efficiency of the fan.

It will be appreciated that pressure will be lost as the air flow passes through regions of changing sectional area in the duct as well as there being a general pressure loss due to friction effects along the length of the duct. Additional losses of pressure at the downstream end are advantageously reduced by the use of the diffuser. Preferably, the dimensions of the diffuser are chosen to recover as much of the pressure head as possible. In many cases, the diffuser dimensions may not be those required for the maximum pressure recovery because of lack of space in the device.

The area ratio of the diffuser outlet to the inlet may be, for example, greater than 3:2, 2:1, 3:1 5:1 or even 10:1; it may be for example less than 100:1, 50:1, 20:1 or 10:1. In a preferred embodiment of the invention, the area ratio of the diffuser outlet to the diffuser inlet is 2.4:1. The areas of the diffuser outlet and inlet are preferably the (transverse) sectional areas measured at the downstream and the upstream ends, respectively, of the diffuser.

The particular size of the diffuser will depend on the device in which it is arranged, the size of the duct and the nature of the fan. In many arrangements, for example where the duct is installed in a computer, the area of the diffuser inlet is preferably greater than 100 mm$^2$, 150 mm$^2$, 200 mm$^2$, or 300 mm$^2$. The area may be less than 1000 mm$^2$, 750 mm$^2$, 500 mm$^2$, or 400 mm$^2$. Further, the area of the diffuser outlet is preferably greater than 500 mm$^2$, 750 mm$^2$, or 1000 mm$^2$.

A long diffuser is preferred but, as indicated above, might not be practical with regard to the layout of the device. Preferably, the length of the diffuser is not less than the mean width of the inlet of the diffuser. Preferably, the length of the diffuser is at least twice, three times, or four times the width of the inlet of the diffuser. Where the cross section of the inlet of the diffuser is generally circular, the mean width will usually be the diameter of the inlet. Where the inlet has a different cross section, the mean width may conveniently be determined by averaging several lengths transverse to direction to the air flow. In some cases the duct might not enclose the air flow on all sides. In such cases the mean width of the duct may be determined from a consideration of the stream of air which in use passes through the duct.

Preferably, the resultant angle of the diffuser is greater than 9, 15, 20 or 30 degrees. The resultant angle preferably is the angle of the wall of the diffuser to the direction of air flow in the duct. In most arrangements, the angle of the diffuser will be limited by the size and layout of the device.

Preferably, the diffuser has a well rounded entry and preferably a well rounded exit. Preferably the kick of the diffuser is also rounded. Such an arrangement is thought to give improved flow characteristics of the air flowing through the diffuser.

Preferably, the duct includes a nozzle. Preferably, the nozzle is arranged adjacent the upstream end of the duct and is a convergent nozzle having a sectional area which decreases downstream. The nozzle converts pressure head at the mouth of the duct into velocity head and assists the formation of the desirable high velocity flow in the duct. By using a nozzle at the upstream end of the duct, air can be brought to a high velocity almost immediately on entering the duct and thus only a small length of duct is required upstream of the first item of equipment to be cooled by the duct. The use of the nozzle also gives smoother flow of the air entering the duct.

Preferably the area ratio of the nozzle inlet to the nozzle outlet is, for example, greater than 3:2, 2:1, 3:1, 5:1 or even 10:1; it may be for example less than 100:1, 50:1, 20:1 or 10:1. In a preferred embodiment of the invention, the area ratio of the nozzle inlet to the nozzle outlet is 2.4:1. The areas of the nozzle outlet and inlet are preferably the (transverse) sectional areas measured at the downstream and the upstream ends, respectively, of the nozzle.

Preferably, the area ratio of the diffuser corresponds to the area ratio of the nozzle.

The apparatus may further comprise a fan.

While reference is made herein to the use of a fan, that term is to be interpreted broadly to include all devices suitable for effecting flow through the duct.

While in many embodiments of the invention, the fluid flowing along the duct is air, it is envisaged that other fluids could be used and where reference is made herein to "air" it should be understood to include reference to such other fluids. For example, the duct could comprise a pipe filled with a cooling fluid, for example water or benzene. A suitable apparatus for moving the cooling fluid along the duct would be used. The term "fan" used herein should be understood to include such other apparatus for moving cooling fluid along the duct.

Preferably, the fan is arranged to suck air through the duct. It is thought that the sucking of air through the duct gives better flow of the air than would be obtained than if the fan were arranged to blow air through the device.

Advantageously, the duct is arranged to generate a flow of air which is faster adjacent the equipment than adjacent the fan. A faster flow of air provides greater cooling of the apparatus, and thus a slower fan speed is required to effect the same cooling if the flow of air is faster adjacent the equipment than adjacent the fan. Thus the cooling apparatus is more efficient. The flow of air through the duct may be closely controlled by careful choice of the shape of the duct as described below.

Advantageously, the duct is arranged to generate a flow of air which varies along the length of the duct. Advantageously, the velocity of the air flow varies along the duct. The duct may be arranged such that the velocity of the air is faster adjacent an item of equipment to be cooled than adjacent a region where less cooling is required. That is particularly advantageous where the cooling apparatus is used to cool several items of equipment. Furthermore, the duct can be arranged such that the air flow adjacent each item of equipment is different. A faster air flow can thus be provided adjacent those items of equipment which require the greater cooling.

Advantageously, the portion of the duct which is arranged to generate the fastest flow of air is remote from the fan, preferably in the half of the duct which is more remote from the fan. The throat of the duct is that part of the duct at which its sectional area is the least. Thus the portion at which the greatest velocity of air flow is achieved usually be at the throat. It has been found that the most efficient cooling of the apparatus and efficient operation of the fan is achieved where the throat of the duct is positioned remote from the fan. For example, where the fan is arranged such that it sucks air through the duct, the throat is advantageously arranged near the upstream end of the duct. Where the duct includes a nozzle, the throat is advantageously arranged immediately downstream of the nozzle. It will be understood that where the fan is arranged to blow air through the duct, the most preferred position of the throat is thought to be near the extreme downstream end of the duct.

Where the diffuser is present, the distance between the outlet of the diffuser and the throat is preferably greater than the distance between the throat and the inlet of the duct to avoid the risk of flow separation in the duct.

The velocity of the air through the duct is conveniently varied along the duct by providing a duct having a variable sectional area. It will be understood that the term "sectional area" of the duct at a particular location preferably refers to a transverse cross-section of the duct being substantially perpendicular to the direction of the flow of air through the duct at that location.

Continuity of the flow of air through the duct requires that as the sectional area of the duct decreases, the velocity of the air flow increases. As the air moves to a region of the duct having a smaller sectional area, pressure head of the air is converted into velocity head. Thus the duct is advantageously arranged so that a region of the duct which is adjacent to an item of equipment to be cooled has a relatively small sectional area, thus giving fast flow of the air.

The aspect ratio of the duct is thought to be of particular importance. The aspect ratio described herein is the ratio of the height of the duct to its breadth at a particular location alone the duct. Where the equipment is mounted on a printed circuit board (pcb), the height of the duct is preferably the dimension of the duct in a direction substantially perpendicular to the upper surface of the board and to the direction of the air flow; the breadth of the duct is preferably the dimension of the duct in a direction substantially perpendicular to the measured height of the duct and to the direction of the air flow. The aspect ratio may for example be greater than 0.01, 0.05. 0.1, or 0.5; it may for example be less than 3, 2, 1, 0.75 or 0.5. Such aspect ratios have been found to give acceptable cooling of the electrical equipment and are suited for the cooling of elongate rectangular components.

In one arrangement, it was found that good cooling of an item of equipment was achieved when the aspect ratio of the duct at the equipment was 0.5. For a similar arrangement, it was found that an aspect ratio of 0.005 (where the duct is a narrow slot) gave worse results.

In a preferred embodiment, the aspect ratio of the duct at a region over a pcb to be cooled is 0.27 as a ratio of the height of the duct to its width in that region.

Furthermore, the height of the duct, for example, the dimension between the equipment and the duct as defined above, is considered to be of importance. Thus, while providing a duct having a low aspect ratio generally gives improved cooling results, it is thought that, for at least some arrangements, there may be a critical height of the duct below which worse results are obtained. In the context especially of cooling electrical equipment, preferably, the height of the duct is not less than 10 mm, 8 mm, or 5 mm.

In one arrangement, it was found that where the height was 15 mm, good cooling results were obtained; good results were also obtained where the height was 12 mm but worse cooling was obtained where the height was 8 mm.

Advantageously, the duct includes means for generating turbulent flow of air in the duct. Turbulent flow gives improved heat transfer from the equipment and therefore increased cooling. Turbulence may be effected, for example, by use of the fan, by increasing the velocity of the air flow in the duct and/or by providing raised areas on the surfaces of the duct. The turbulence may be localised in specific regions of the duct. The means for generating turbulent flow may be one or more protrusions.

It has been found, however, that in some cases the generation of turbulent flow can cause a decrease in the performance of the cooling apparatus in regions downstream from the region of generation of the turbulent flow.

Advantageously, an interior surface of the duct is provided with a raised portion. In some cases, the equipment to be cooled will include a component which generates a large amount of heat and which requires a particularly high air velocity to cool it.

The raised portion provides a localised region in the duct having an increased flow velocity. The raised portion may thus be arranged to be immediately adjacent the equipment to be cooled. The raised portion advantageously has a configuration (for instance by the provision of the appropriate protuberances and flow velocities) such that it causes turbulent flow in the region of the raised portion. Turbulent flow of the air in the duct can improve the heat transfer from the equipment.

While the provision of the raised portion can give improved cooling in the region of the raised portion, it can lead to reduced flow velocity downstream. It has been found that the reduction in flow velocity downstream from a raised portion can be of the order of 30 to 40%. As indicated above, while providing the duct with a low aspect ratio can improve cooling by inter alia increasing the flow velocity, if the aspect ratio is too low, the cooling can be reduced, in particular downstream of the region having the low aspect ratio. That can be disadvantageous in the case where further items of equipment to be cooled are located downstream.

Advantageously, the duct includes a by-pass in the region of the raised portion. The by-pass provides an additional route for the air flow at the raised portion. Preferably, the raised portion extends across less than the whole width of the duct at the raised portion. It will be understood therefore that the raised portion preferably extends neither across the whole breadth nor height of the duct. In such an arrangement, a portion of the air flow will pass over the raised portion with a high velocity, while a further portion will by-pass the raised portion by flowing around the side of it.

Where an item of equipment is arranged adjacent the raised portion, the high velocity air flow will pass between the raised portion and the equipment. Thus, the provision of the raised portion preferably provides the duct with a localised region having a particularly high flow velocity (due to the apparent low aspect ratio of the duct at the raised portion) while retaining the desired cooling by the air flow downstream of the raised portion.

Preferably, the area ratio of the inlet of the duct (for example the nozzle inlet where a nozzle is present) to the duct at the raised portion is greater than 3:2, 2:1, 3:1 or 4:1. In a preferred embodiment, the ratio is 2.85:1.

Advantageously, the duct includes a formation for attaching the equipment to the duct.

This important feature is also provided independently and thus, the invention further provides a cooling apparatus for cooling electrical equipment using a fan, the apparatus comprising a duct for communication with the fan and for transporting air past the equipment, the duct including a formation for attaching the equipment to the duct.

The formation may include detents for locking the equipment to the duct. The formation may be a slot for receiving a printed circuit board and the slot may include a detent. The direct attachment of the equipment to the duct can help to improve the performance of the cooling apparatus. The shape of the duct may be carefully designed so that the desired air flow is achieved at each component of the equipment. Where the equipment is attached to the duct, the components of the equipment may be brought into line with the desired section of the duct.

The duct may, advantageously, also include a formation for attaching the duct to the electrical device.

A surface of the equipment may form a wall of the duct. For example, where the item of equipment comprises a circuit board, the duct may comprise a channel having a generally unshaped section, the circuit board being attachable over the open side of the section. Thus the components of the equipment to be cooled may be located within the duct, directly in the air flow.

While the invention finds particular application in the cooling of electrical equipment, the cooling apparatus of the invention may also be used to cool other types of equipment. Accordingly, the invention also provides a cooling apparatus for cooling equipment, the apparatus comprising a duct for communication with a fan for generating a flow of air through the duct past the equipment. Advantageously, the duct is arranged to generate a flow of air having a velocity which varies along the duct. In that way, different rates of cooling may be provided at different positions along the length of the duct. As indicated above, that feature is most advantageous.

The invention also provides cooling apparatus for cooling equipment, wherein the cooling apparatus is arranged to effect a faster rate of cooling at a first region of the equipment that at a second region of the equipment.

Conveniently, and for ease of manufacture, the duct has a generally rectangular (transverse) cross-section, although it is envisaged that other shapes of duct could be used. For example, the cross-section of the duct may be generally circular.

Preferably, the duct is formed by injection moulding. Preferably, the duct is formed as a single moulded piece.

Advantageously, both the breadth and the height of the duct vary along the duct. Preferably, where the sectional area of the duct increases or decreases, all of the walls of the duct are flared outwardly or inwardly, respectively. For example, it is thought that it is preferable for the diffuser portion of the duct to be generally funnel-shaped.

The invention also provides a cooling apparatus for cooling electrical equipment using a fan, the apparatus comprising a duct for communication with the fan and for transporting air past the equipment, in which the sectional area of the duct varies along the duct. Preferably, both the breadth and the height of the duct (for example as defined above) vary along the duct. Thus greater control of the amount of cooling at various regions along the duct may be achieved.

Furthermore, the dimensions of the duct may be varied to correspond to the dimensions of items of electrical equipment to be cooled. Also, where the electrical device includes several items of electrical equipment, the shape of the duct can be chosen so that selected ones or all of the items are cooled.

Preferably, the duct or ducts of the cooling apparatus cover substantially all of the items of electrical equipment of the device.

The invention further provides a cooling apparatus for cooling electrical equipment in an electrical device using a fan, the apparatus comprising a duct for communication with the fan, wherein the apparatus may be arranged such that a surface of the device is substantially completely covered by the cooling apparatus.

Preferably the surface of the device is substantially completely covered by the duct or ducts of the cooling apparatus.

For example, where the items of electrical equipment are mounted on a circuit board in the device, preferably the duct or ducts cover substantially all of the circuit board.

Further, where the device is generally rectangular, the duct is preferably also rectangular and of a similar size to the device.

In many arrangements, it can be advantageous for the duct to be curved. For example, where the equipment to be cooled includes several components, those components may not necessarily be arranged rectilinearly. Components of such an arrangement may all be cooled using a single curved duct and thus only a single fan is necessary for the cooling of those components. Preferably, and in particular where the duct is a curved duct as described above, the duct is "totally diffusing". Thus the sectional area of the duct becomes progressively greater along the duct in the direction of the air flow. It will be understood that the duct may include one or more raised portions or regions of reduced sectional area as described herein but that preferably such raised portions and regions are not taken into account when considering whether or not the duct is "totally diffusing". By arranging the duct so that its area increases along the direction of air flow, some pressure recovery may be obtained along the duct.

Also, the presence of a curved region in the duct will alter the air flow in the duct. It is thought that that may be advantageous, in particular where the use of the curved duct generates turbulence in the air flow in the duct.

In a preferred embodiment of the invention, the duct doubles back on itself. That may be achieved by providing in the duct a bend of 180° or a combination of bends, for example two 90° bends. Thus, in some embodiments of the invention, the direction of air flow into the duct may be substantially opposite to that of the air flow out of the duct.

It will be understood that further bends in the duct may be provided to provide a particular pattern of air flow for a particular equipment layout. Especially if the duct doubles back on itself, more components can be cooled using fewer (or only one) fan.

The apparatus may comprise a plurality of ducts. Each duct may communicate with a separate fan, although naturally this is not essential. An arrangement of the ducts and the fans may be designed having regard to the size of the equipment to be cooled and the layout of the components of the equipment. For example, light cooling of a series of components requiring relatively little cooling may be provided by one duct while another series of components requiring more cooling could be cooled by a separate duct.

Furthermore, each duct may comprise more than one passage for the flow of air. The arrangement is advantageously such that the flow is different in the different passages. For example, the velocity of air flow in the passages may be different. The passages may be provided with different sectional profiles.

In some embodiments, it will be preferable for the apparatus to include a plurality of ducts which are in communication with each other. In that way, air flowing through a first duct may be diverted so that it flows through a second duct. That can be of particular benefit where the second duct includes a "hot" item of equipment which requires a high level of cooling.

Preferably, the cooling apparatus includes a conductive member for conducting heat between the electrical equipment and the duct. When the equipment is active, it generates heat. Advantageously, the heat is removed from the equipment. In accordance with the invention, a conductive member preferably conducts excess heat generated by the equipment from the equipment to the duct.

This important feature is provided independantly and thus the invention also provides a cooling apparatus for cooling electrical equipment, the apparatus comprising a conductive member for conducting heat away from the equipment.

Preferably the conductive member is in contact with the equipment when the equipment is arranged in the cooling apparatus. Thus the transfer of the heat away from the equipment may be more efficient.

The conductive member may comprise any material which is sufficiently thermally conducting to conduct heat from the equipment at an acceptable rate.

In a preferred embodiment, the conductive member comprises a composite material including a material having a relatively higher thermal conductivity in a matrix of a material having a relatively lower thermal conductivity. The conductive member preferably comprises a filled plastics material, preferably a filled resin. Preferably, the material is one which is mouldable, preferably by injection moulding. Preferred plastics include polypropylene. The filler may include a metallic material, for example aluminium, steel or ferrite, and/or may include a non-metallic material, for example graphite.

Preferably, the material includes at least 40%, 50%, 60% or 70% of the filler by weight. Materials including 60% by weight of the filler material are particularly preferred.

The shape of the particles of the filler material is thought to be important from a consideration of the transfer of heat in the material. It is thought that generally spherical particles of filler material would give the desired even heat transfer. Long fibres of filler material might give undesirable directional heat transfer.

In a preferred embodiment of the invention, short fibres of filler material are used, preferably having a length of less than 1 mm, 0.5 mm or 0.2 mm. The width of such particles might be about 0.01 mm. The preferred aspect ratio of the particles is less than about 100, 50 or 10.

It will be understood that other materials having the desired thermal conductivity could be used. For example, the conductive member may be of metal. Particularly preferred are those materials which may be moulded, especially those which may be injection moulded.

In a preferred embodiment of the invention, polypropylene filled with about 60% by weight of filler material having a particle size of about 0.2 mm was used for the conductive member.

Alternatively, or in addition, the conductive member may include a thermally conductive coating. For example, the conductive member may comprise a material having a low thermal conductivity and including at least a partial coating of a material having a higher thermal conductivity. The coating may include a metallic coating.

The conductive coating may be applied by spraying, for example using spray paint techniques, or may be applied by electroplating techniques, vacuum sputter techniques or by any other suitable method.

The conductive member is preferably connected to an element which conducts heat away from the conductive member. The element is preferably one which is thermally conductive.

In one embodiment, the conductive member may be attached to a surface of the device, for example the casing.

In an alternative embodiment, the conductive member is attached to a heat sink. The heat sink may be a duct as described above for the flow of air, or may be, for example, a rod or sheet of conductive material, or may be a duct for a cooling fluid other than air. For example the heat sink may comprise a sealed pipe through which is pumped water, benzene or other cooling fluid. Alternatively, the heat sink may comprise a sheet of material preferably having fins for more effective transfer of heat to the air. Preferably the heat sink is able to be moulded, preferably by injection moulding, and preferably includes filled plastics material.

In some cases, the provision of the heat sink may provide adequate cooling without the presence of a conductive member in contact with the equipment.

The invention therefore, further provides a cooling apparatus for cooling electrical equipment, the apparatus comprising a heat sink for transporting heat away from the equipment. The heat sink may comprise a duct.

The apparatus may include a cooling fluid which flows along the duct, but it is envisaged that where the duct comprises conductive material, in some arrangements, no cooling fluid would be required.

In such arrangements, the cooling apparatus may or may not include a fan.

If the apparatus comprises a duct, preferably, at least a portion of the duct comprises conductive material. Preferably, substantially all of the duct comprises conductive material. The conductive material may be the same as that of the conductive member. Thus the duct may be formed of a filled plastics material and/or may include a conductive coating as described above.

Thus the heat generated by the electrical equipment may be conducted away from the equipment along the conductive member and along the conductive material of the duct.

Preferably, the conductive member is resilient. Where the conductive member is in contact with the electrical equipment, better contact and thus better heat transfer between the equipment and the member may be obtained if the member is resilient. Also, equipment of different sizes may be accommodated by the conductive member.

The shape of the conductive member is thought to be of importance having regard to the manufacture of the member and its conductive properties. Preferably, the conductive member is in the form of a leg which may be generally u- or j-shaped. The member may be in the form of a straight leg having a foot; the foot may be resilient.

Preferably, where the duct is formed by moulding, the conductive member is moulded in one piece with the duct.

The invention also provides a conductive member for a cooling apparatus according to the invention.

Furthermore, the conductive material is preferably a material which provides electromagnetic (EM) shielding as described below.

Preferably, the apparatus comprises an electromagnetic shield. The electromagnetic shield preferably reduces electromagnetic radiation emitted from the device by the electrical equipment.

This important feature is also provided independently. Hence, the invention also provides a cooling apparatus for cooling electrical equipment using a fan, the apparatus comprising a duct for communication with the fan and for transporting air past the equipment, the apparatus comprising an electromagnetic (EM) shield.

The EM shielding may be provided using EM shielding material which may be metallic, for example a metal sheet, or may be filled plastics material. The filled plastics material may comprise a resin filled with a metallic material. Preferably, the resin comprises polypropylene and preferably the metallic material comprises particles of aluminium, steel or ferrite. The filler may be graphite.

Preferably, the filled material includes at least 40%, 50%, or 60% filler by weight.

Preferably, the duct comprises an electromagnetic shield. As indicated above, in preferred arrangements, the duct is arranged adjacent the electrical equipment and, preferably, where a device includes a plurality of items of electrical equipment, the equipment is arranged within a duct of the cooling apparatus. Thus, preferably, the duct forms an EM shield.

Thus the duct may comprise filled plastics material.

Alternatively, or in addition, a metallic coating could be provided on at least a part of the cooling apparatus to form an EM shield. The duct may be provided with a metallic coating to provide EM shielding.

The surface of the device may include one or more circuit boards carrying electrical equipment. Where the device has an EM shield, it is preferable that the EM shield extends to cover substantially all of the equipment in the device.

In one preferred embodiment the duct (and preferably the conductive member) comprise filled plastics material having a metallic coating. It is thought that in some cases the filled plastics material alone might not provide adequate EM shielding and a further coating will be desirable.

In a particularly preferred embodiment of the invention, the duct, and preferably the conductive member, comprise a thermally conductive material which provides EM shielding and the duct covers substantially all of the electrical equipment of the electrical device.

The cooling apparatus may further comprise electrical equipment in communication with the duct. The equipment may be in the form of an electronic component such as a discrete semiconductor device, for example an integrated circuit, or may be an electronic circuit board. The items of equipment may all be at different locations and, as described above, may all be cooled by means of a single duct or by several ducts.

The electrical equipment may be attachable to the cooling apparatus. Preferably the equipment is releasably attachable to the cooling apparatus. As described above, the equipment may be attachable to the duct. A surface of the equipment and/or of the electrical device may provide a wall of the duct.

The cooling apparatus may include a plurality of items of equipment, each of which may comprise several components.

The invention also provides an electrical device comprising a cooling apparatus as described above.

For example, the electrical device may comprise a casing containing one or more items of equipment mounted in the casing. The device includes a fan, for example in the casing, although it is envisaged that the fan may be arranged remote from the device.

The device will often include a power supply unit. Where the device also includes a fan, preferably the fan is arranged to generate a flow of air past the power supply unit. Thus the fan may be used to cool the power supply. In a preferred embodiment of the invention, air passes from the duct, through the fan and onto or into the power supply unit.

A surface of the device may provide a wall of the duct. Preferably a wall of the casing provides a wall of the duct. The duct may comprise an attachment fitted to the inside the device, for example fitted to the casing. Thus more than one wall of the casing may provide walls of the duct. It is envisaged that the duct may be provided as an integral part of the device itself. For example, the inside of the casing may be moulded, or include attachments, to form one or more ducts for air flow. Thus the walls of the duct may be provided by a combination of surfaces of the device, for example surfaces of the casing and surfaces of the electrical equipment and/or of the device.

Accordingly, the invention further provides a duct portion, the duct portion having a configuration such that it may be assembled with one or more further duct portions to form a duct for generating a flow of air which varies along the duct.

Also provided by the invention is a duct portion, the duct portion being able to be assembled with one or more further duct portions to form a duct for a cooling apparatus as described above.

Preferably, the duct portion has the form of a channel.

The duct portions assembled to form the duct may all be the same, but advantageously they are different. For example, one duct portion may comprise a formation having a particular configuration such that when it is attached to the equipment (which forms a further duct portion), a duct having a desirable configuration is formed.

In a further preferred embodiment, the duct portion is generally in the form of one or more surfaces for directing the flow of air. The topography of the one or more surfaces advantageously varies along the length of the duct portion so that, when the duct portion is assembled with, for example a circuit board, a duct is formed which can generate a flow of air which varies along the length of the duct.

Preferably, the duct portion includes a formation for attaching the equipment and/or the device to the duct portion.

The invention also provides a duct portion for a cooling apparatus duct, the duct portion comprising raised formations for varying the velocity of flow in the duct.

Also provided by the invention is a method of cooling equipment using a cooling apparatus, the cooling apparatus comprising a fan and a duct in communication with the fan, the method comprising transporting air through the duct past the equipment.

Advantageously, the flow of air adjacent the equipment is faster than the flow of air adjacent the fan and, advantageously, the flow of air in the duct varies along the length of the duct. Advantageously, the velocity of the air flow varies along the duct.

The invention also provides a duct for a cooling apparatus, the duct being as described above.

The various features of the different aspects of the invention may be applied interchangeably to other aspects of the invention. Furthermore, each feature disclosed in the description, the claims and/or the drawings may be provided independently or in any appropriate combination.

Preferred features of the present invention will now be described, purely by way of example, with reference to the accompanying drawings of which:

FIG. 4 shows a cross sectional view of the duct 2 taken at A—A of FIG. 3;

FIG. 5 shows a cross section of duct 3 taken at B—B of FIG. 3;

FIG. 6 shows a plan view of the upper surfaces of the duct arrangement;

Figure 1:
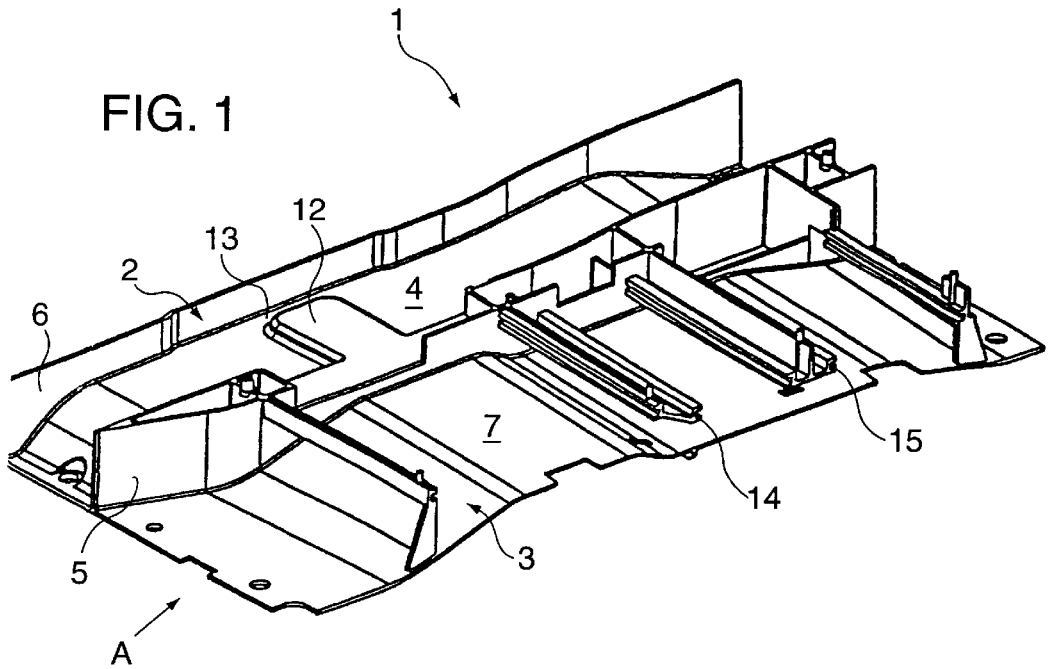
FIG. 1 shows a perspective view of the lower surfaces of a duct arrangement for a cooling apparatus according to the invention.
Figure 2:
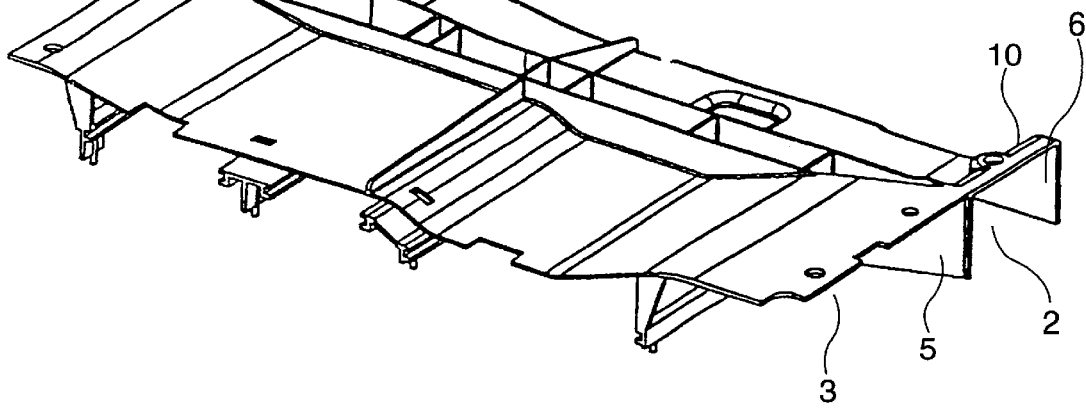
FIG. 2 shows a perspective view of the upper surfaces of the duct arrangement of FIG. 1.

FIG. 1 shows a duct arrangement 1 for a cooling apparatus. The duct arrangement 1 includes two ducts 2, 3. Duct 2 comprises a roof 4 and two generally parallel side walls 5, 6 perpendicular to the roof 4. The height of the roof 4 varies along the length of the duct 2. Duct 3 also includes a roof 7 and shares a common wall 5 with duct 2. Duct 3 has only one side wall, the other side wall is provided by a surface of the electrical device as described below. FIG. 2 shows the upper surfaces 8 of the duct arrangement 1 of FIG. 1. Arrow A shows the direction of airflow through the ducts 2, 3. The air is sucked through each duct 2, 3 by a fan (see FIG. 12). Thus two fans are used: one for duct 2; one for duct 3. The arrangement could be modified so that only one fan was used.

The duct arrangement 1 is injection moulded all in one piece. Where the duct is moulded, the duct may be formed from any suitable mouldable material, in particular plastics material. One suitable plastics material is polyphenylene oxide. When the duct is installed in the electrical device, the local temperature at the duct is likely to reach 70° C., 80° C. or more. Thus the material from which the duct is formed should usually be one which has acceptable physical and chemical stability at such temperatures. The duct could be made using a die casting method. The duct could be made of metal, for example of brass.

Figure 12:
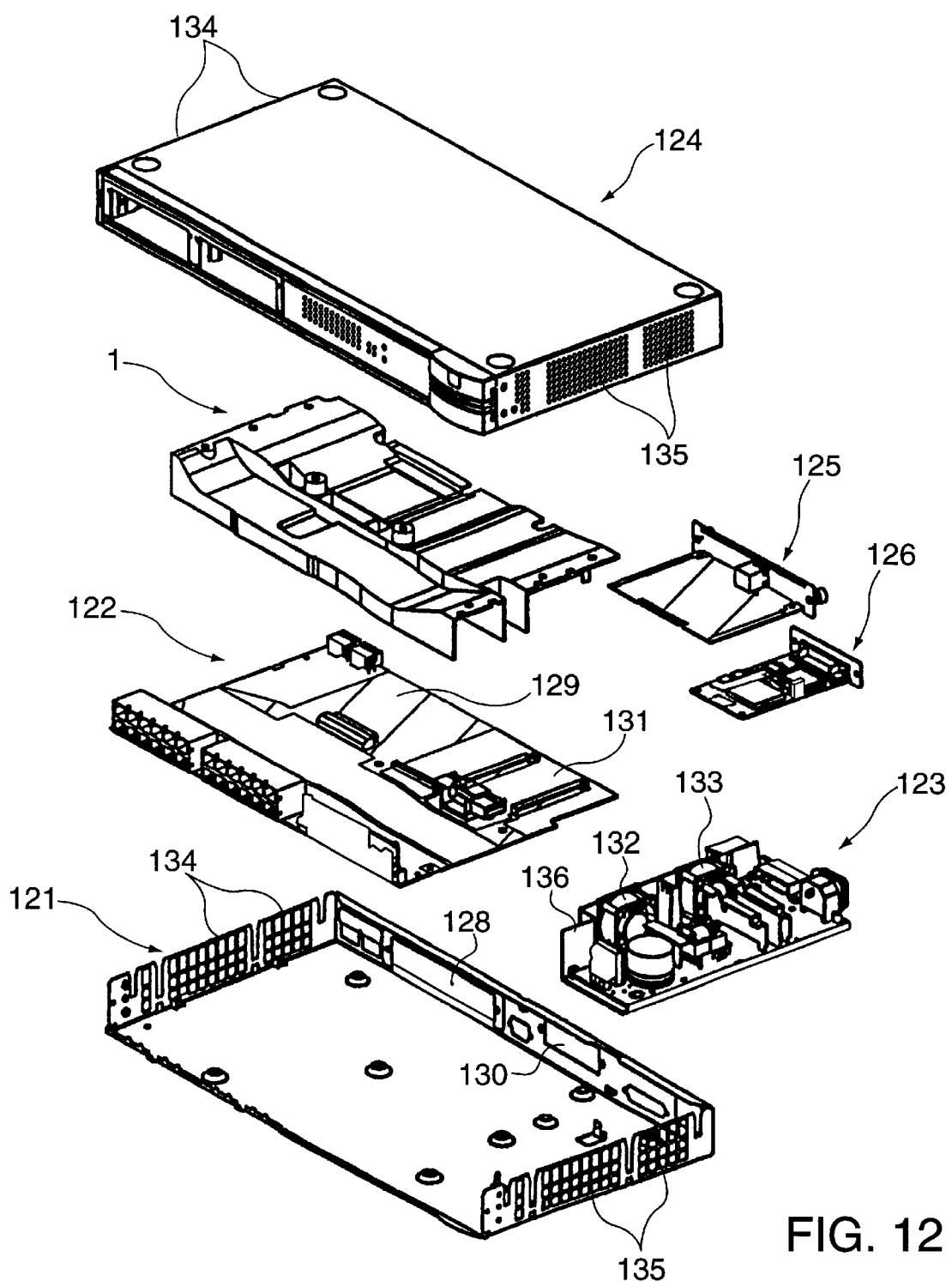
FIG. 12 shows an exploded view of a duct arranged in an electrical device.

In use, the duct arrangement 1 is arranged within an electrical device. FIG. 12 shows an exploded view of a duct arrangement 1 in an electrical device. The device includes a lower casing 121 a board 122 onto which electrical equipment may be mounted, a fan assembly 123, a cover 124 and slot-in circuit boards 125, 126 for location in the slots 15 of the projections 14 of duct 3.

The board 122 and the fan arrangement 123 are located in the lower casing 121. The board 122 will, in use, usually include electrical equipment (not shown) mounted on its surface. In the arrangement shown in FIG. 12, several items of electrical equipment will be located in strip 127 of the board 122.

The duct arrangement is located over the board 122 and the cover 124 is fitted over the whole arrangement. The duct arrangement 1 may sit on the upper surfaces of the board 122 and may be fastened to the board 122. In an alternative arrangement, the duct arrangement 1 may be attached to, or be an integral part of, the cover 124.

The circuit boards 125, 126 may be inserted into the slots 15 of the duct 3 before assembly of the device. In the arrangement of FIG. 12, however, the circuit boards 125, 126 are to be inserted after assembling the device. Circuit board 125 is inserted through opening 128 of the casing 121 (and any corresponding opening in cover 124) and into the slots 15 of the duct 3 so that it is held between region 129 of the board 122 and the duct roof. Similarly, circuit board 126 is inserted into opening 130 and is held in slots 15 between the roof of the duct 3 and region 131 of the board 122.

The fan arrangement 123 includes two fans 132, 133. Fan 132 sucks air through duct 2; fan 133 sucks air through duct 3. Air passing through the duct is drawn through grilles 134, through the ducts over the equipment on strip 127 (duct 2) and the circuit boards 125, 126 (duct 3), past the fans and out through grilles 135. The fan arrangement 123 includes a PSU (power supply unit) baffle 136 to reduce the flow of air from grilles 134 through the fan.

It will be seen that the board 122 provides a wall of the ducts 2,3. Further, the rear wall of the casing 121 provides a side wall of duct 3.

The fans 132, 133 are 40 mm by 40 mm by 20 mm axial fans having a flow rate of 5.4 cfm. (0.0025 m$^3$/s)

Figure 3:
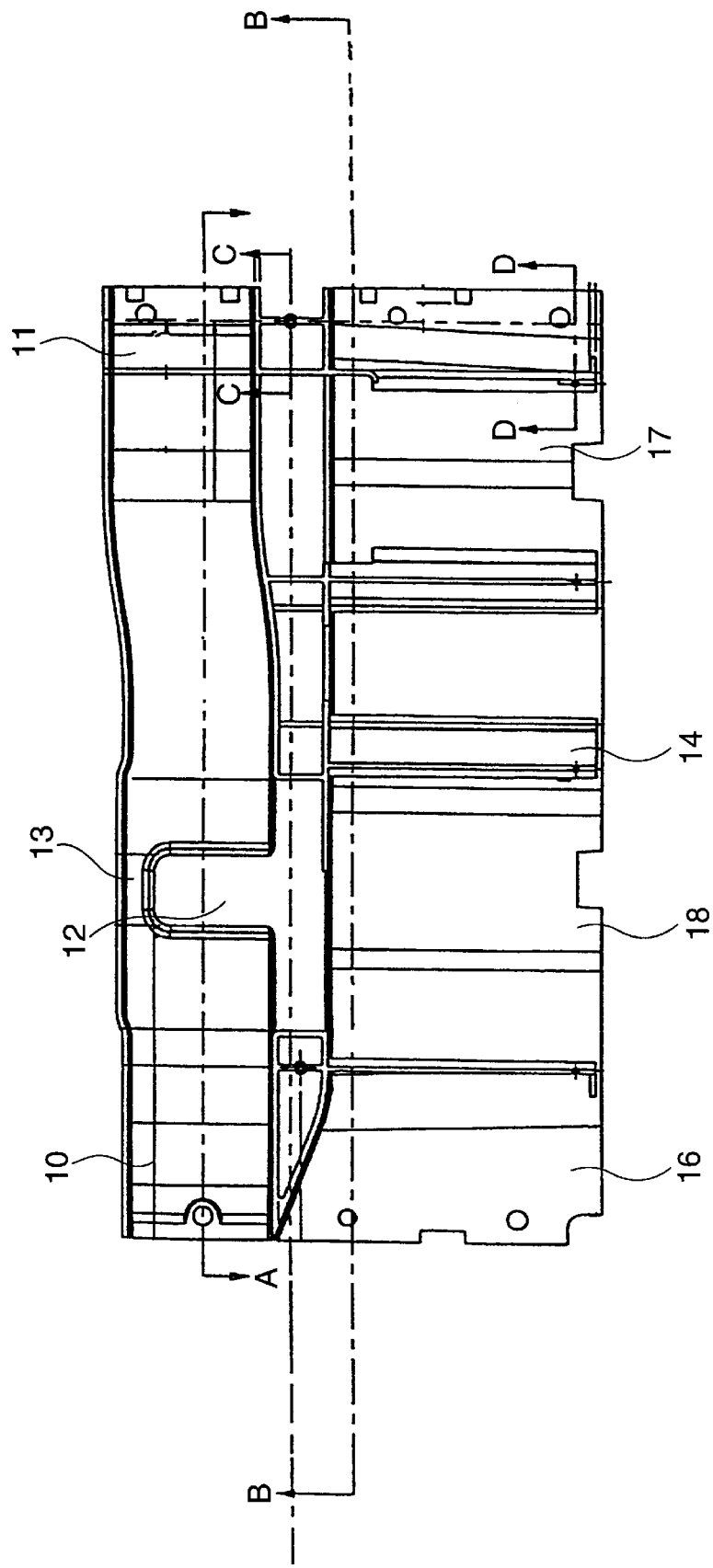
FIG. 3 shows a plan view of the lower surfaces of the duct arrangement.
Figure 7:
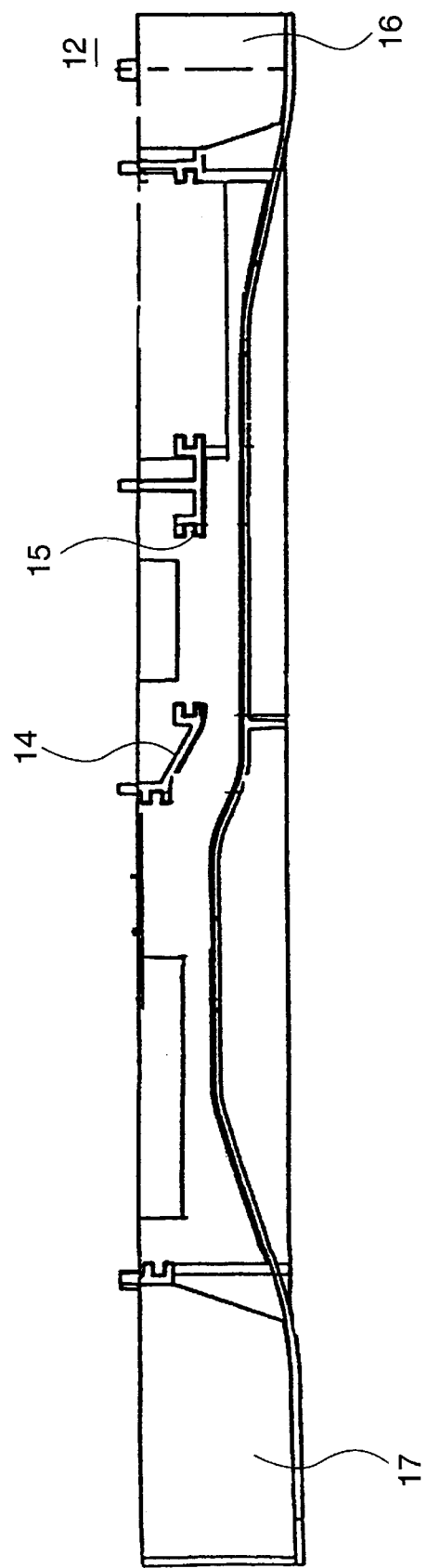
FIG. 7 is a further cross sectional view of the duct 3.
Figure 8:
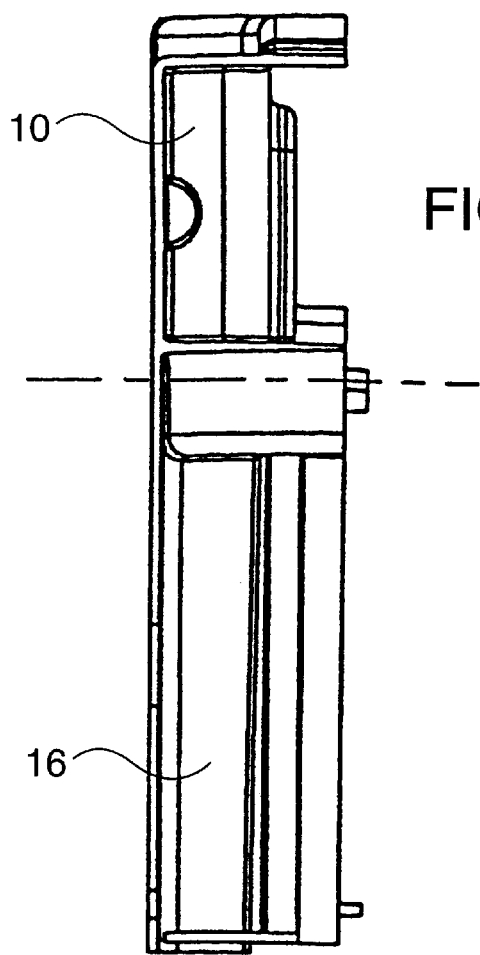
FIG. 8 is an end view of the duct arrangement showing the nozzles.
Figure 9:
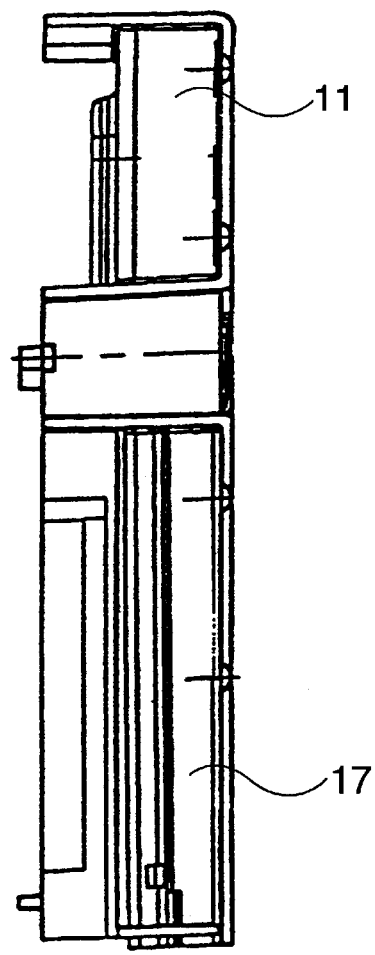
FIG. 9 is a view of the other end of the duct arrangement showing the diffusers.
Figure 10:
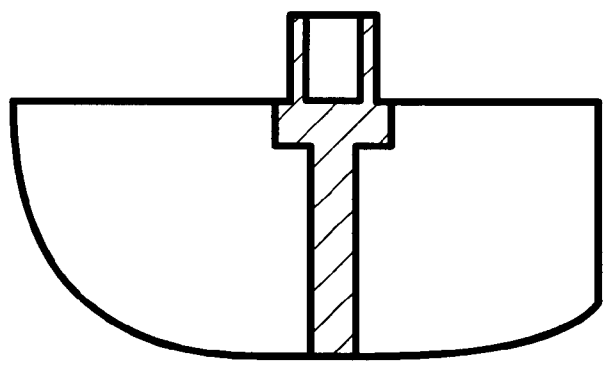
FIG. 10 shows a cross sectional view at C—C of FIG. 3.
Figure 11:
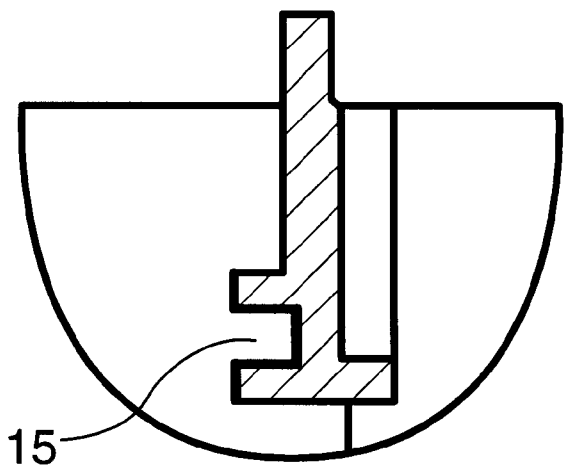
FIG. 11 shows a cross sectional view at D—D of FIG. 3.

From a consideration of FIGS. 2 to 4, it will be seen that the duct 2 includes a nozzle 10 and a diffuser 11. Also provided in duct 2 is a raised portion 12. The raised portion does not extend across the whole width of the roof 4. The space between the raised portion 12 and the side wall 6 forms a by-pass 13.

FIGS. 1 to 11, at least, are substantially to scale. The length of duct 2 measured from the inlet of the nozzle to the outlet of the diffuser is about 331.5 mm.

When the duct arrangement 1 is assembled with the equipment and the fan is activated, air flows into the nozzle 10 of the duct 2. The sectional area of the nozzle 10 reduces downstream. Pressure head of the air flow is converted to velocity head and thus the velocity of the air in the duct 2 increases. Electrical components downstream of the nozzle 10 are cooled by the high velocity air flow. A component that requires particular cooling is arranged directly adjacent the raised portion 12. An example of such a component is a TBGA (tape ball grid array) device. At the raised portion 12, part of the air flow will pass between the raised portion 12 and the component. The sectional area between the raised portion and the component is low and thus the velocity of the air flow over the component is high. Furthermore, the upstream face of the raised portion 12 causes turbulent flow between the raised portion and the component. The high velocity turbulent flow between the raised portion and the component leads to particularly good heat transfer from, and hence cooling of, the component. The by-pass 13 provides a further route for the air flow to mitigate the loss of flow velocity downstream from the raised portion 12. It will be seen that the side wall 6 is deflected slightly outwardly in the region of the raised portion to increase the width of the by-pass 13.

In many embodiments, the size of the raised portion is smaller than the size of the adjacent item of equipment, for example the chip, to be cooled. Preferably, the chip is arranged so that the raised portion lies adjacent the middle section of the chip. Usually, the middle of the chip will be the hottest region and therefore requires the greatest cooling.

At the diffuser 11, velocity head of the air flow is converted to pressure head thus giving some recovery of pressure.

For a diffuser having a generally circular cross section, it is expected that, where the diffuser has the following dimensions, pressure recovery of about 60% is achievable:

Length=53 mm

Hydraulic Radius at Inlet=10.6 mm

Hydraulic Radius at Outlet=19.4 mm

Resultant Angle=9.4 Deg

In practice, however, it has been found that for the diffuser used in FIG. 1 (which has a generally rectangular cross section), pressure recovery of between 8% and 18% is achieved, for example about 10%. While that recovery is less than the theoretical pressure recovery which might be achieved, it is still significant having regard to the improved efficiency obtained.

Figure 13A:
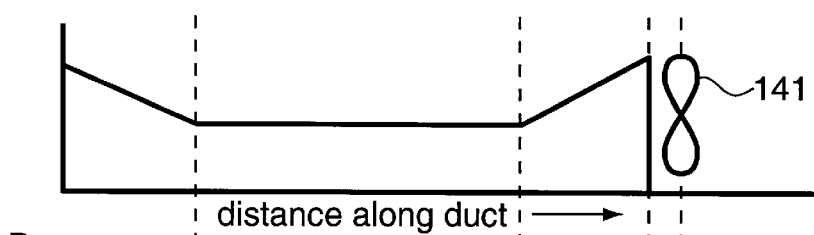
FIGS. 13a and 13b show a profile of pressure along a duct.
Figure 13B:
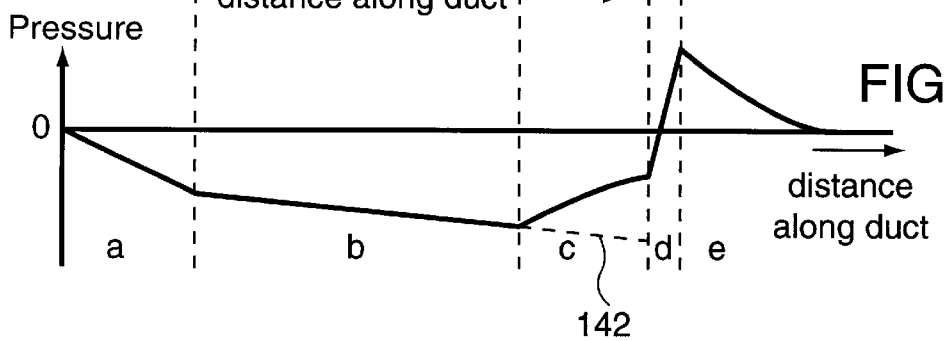

FIGS. 13a and 13b show the pressure profile along a duct. FIG. 13a shows a representation of the profile of the duct and the position of the fan 141. The duct of FIG. 13a includes a nozzle at the upstream end of the duct and a diffuser immediately upstream of the fan 141. The fan 141 sucks air through the duct.

FIG. 13b is a graph representing the pressure in the duct at the various regions. The graph is not necessarily to scale. In region a of the graph, the pressure falls as pressure head is converted to velocity head as the air flows through the nozzle. Some further pressure is lost along the duct upstream of the diffuser (region b) due to frictional and other effects. In region c, the diffuser, some of the lost pressure is recovered. For some embodiments a recovery of between 8 and 18% has been achieved. Broken line 142 indicates the further pressure loss which might occur if the diffuser were not present and the duct extended to the fan. In region d, at the fan, pressure is lost as the air flows away from the fan.

Figure 14:
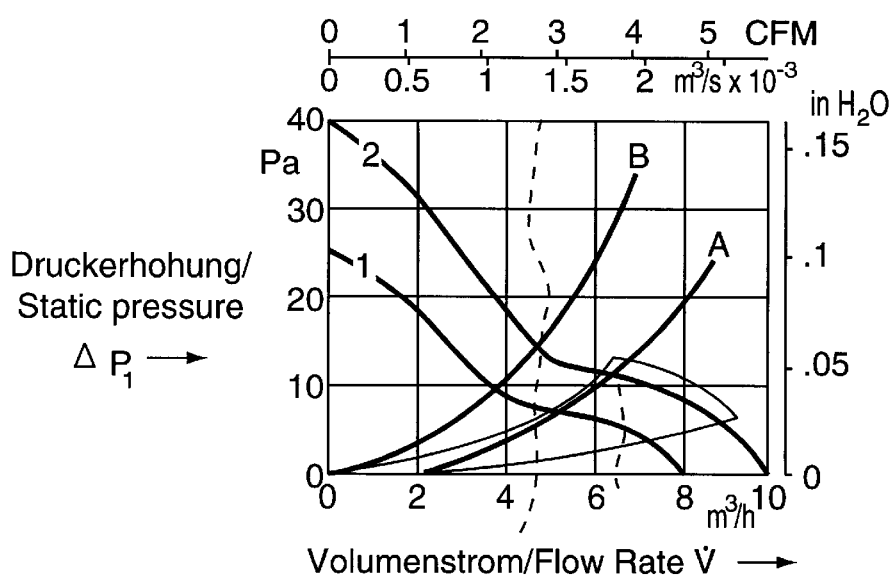
FIG. 14 shows a graph of pressure against flow rate in a duct.

FIG. 14 shows a graph of the pressure at various flow rates for two arrangements A and B. Arrangement A includes a diffuser, arrangement B does not. The maximum flow rate achievable by the fan 131 is, for the graph of FIG. 14, 5.4 cfm. (0.0025 m$^3$/s).

For arrangement A the flow rate of the air in the duct is about 4 cubic feet per minute (cfm) and thus the fan is operating at about 75% efficiency. For arrangement B a flow rate of only 3 cfm was achieved indicating that the fan was running at only 56% efficiency in that arrangement. Thus the use of the diffuser is seen to be advantageous.

The duct 3 includes projections 14 extending from wall 5. As can be seen from FIG. 5, there is a space between the projections 14 and the roof 7. The projections 14 include slots 15 for the insertion of circuit boards (not shown). When the circuit boards are located in the slots of the projections 14 and the duct arrangement is mounted in the electrical device, a passage is formed which is bounded by roof 7, wall 5, the surfaces of the circuit boards and a surface of the electrical device.

It will be seen, from for example, FIG. 1, that the first and last projections 14 each include a leg connecting the projection 14 and the roof 7 of the duct 3. That helps to reduce shrinkage or deformation of the projections which are formed by injection moulding.

It will be seen from a consideration of, for example, FIG. 5, that duct 3 also includes a nozzle 16 and a diffuser 17. Duct 3 additionally includes a raised segment 18 in the region between two projections 14. The raised segment 18 corresponds to the position of a circuit board inserted into the slots 15 of the projections 14. It will be seen that the distance between a circuit board mounted in each pair of slots and the roof adjacent the circuit board is substantially the same for each circuit board. It is envisaged, however, that the distances could be different, for example where one board requires more cooling than another board.

The position of the nozzle 16 and diffuser 17 are having regard to the cooling required for electrical equipment at the upstream edge of the first circuit board and the downstream edge of the last circuit board in the duct 3.

FIGS. 6 to 11 show further views of the duct arrangement.

Tests were carried out to assess the use of embodiments of the cooling apparatus of the present invention.

EXAMPLE 1

The effect on the temperature of electrical equipment by the cooling apparatus of the present invention was assessed. For all of the measurements made, the device included a cooling fan. Some of the measurements were made for an arrangement in which the device further included a duct in accordance with the present invention.

Electrical equipment to be tested was arranged in a device similar to that shown in FIG. 12. The equipment was arranged in strip 127 so that it lay within duct 2 in the test (where the duct was used). Fan 132 had a flow rate of 0.002 $m^3$/s. The equipment tested is listed in Tables 1 to 4 below. The device called "Balti" (where used) was arranged directly beneath the raised portion 12 of the duct.

Where equipment to be tested was unavailable, the test was carried out using resistors in the place of the item of equipment, the resistors being chosen to have a power output, and thus a heat output, similar to that of the equipment.

For comparative tests, no duct was used.

For the tests, the fan was switched on and the equipment activated. After a delay of about 10 minutes in which the equipment generated heat, the air temperature and the air velocity at various regions along the air flow was recorded and the temperature and velocity at the equipment interpolated.

Where possible, the air temperature was taken upstream and downstream of the equipment and thus the air temperature at the centre of the item of equipment could be estimated.

From those results, the approximate junction temperature of the equipment was calculated (see below). The results are given in Tables 1 to 4 corresponding to Tests 1 to 4 as follows:

Test 1

The apparatus was set up as shown in FIG. 12. The fan arrangement 123 included the PSU baffle 136. The duct arrangement 1 was located on the board 122 separately from the cover 124.

Test 2

The apparatus was as for Test 1 except that the duct arrangement 1 was attached to the cover 124 and thus the cover and ducts were located onto the board as a single unit. There was a small gap between the walls 5,6 of the duct 2 and the board 122.

Test 3

The apparatus did not include the duct arrangement 1. The fan arrangement 123 included the PSU baffle 136.

Test 4

This test indicates, for the apparatus of Test 3, how many fans would be required to give the cooling achieved in Tests 1 and 2.

The devices referred to in the tables are various silicon chips.

From a comparison of the results of Tables 1 and 2 and Table 3, it can be seen that a significant improvement in the cooling of the equipment may be achieved using the duct. Table 4 shows that to achieve similar cooling to that shown in Tables 1 and 2 for the apparatus of Test 3, as many as 14 fans are required.

A junction temperature of 130° C., such as that seen in Test 3, is considered to be catastrophic for many of the items of electrical equipment. A junction temperature of less than about 110° C. is considered acceptable.

TABLE 1

| Device Downstream | Velocity m/s | External Ambient deg. C. | Power Upstream W | Flow Area $cm^2$ | Maximum Power W | Air Temperature deg. C. | Interpolate Velocity m/s | thetaJA deg. C./W | Maximum Power W | Junction Temperature deg. C. |
|---|---|---|---|---|---|---|---|---|---|---|
| Phy 1 | 0.84 | 0 | 3 | 6.6 | 3 | 6.5 | 0.84 | 15.3408641 | 3 | 102.57137 |
| Phy 2 | 0.99 | 0 | 6 | 6.1 | 6 | 9.2 | 0.815 | 14.263872 | 3 | 101.9521476 |
| Balti | 1.96 | 0 | 12 | 6.6 | 3 | 8.6 | 1.475 | 7.15 | 6.8 | 107.1735058 |
| Phy 3 | 1.99 | 0 | 15 | 6.6 | 3 | 10.5 | 1.975 | 11.8554114 | 3 | 96.09893199 |
| Phy 4 | 1.74 | 0 | 18 | 10.03 |  | 9.5 | 1.865 | 11.8854847 | 3 | 95.16855724 |

TABLE 2

| Device Downstream | velocity m/s | External Ambient deg. C. | Power Upstream W | Flow Area $cm^2$ | Maximum Power W | Air Temperature deg. C. | Interpolate Velocity m/s | thetaJA deg. C./W | Maximum Power W | Junction Temperature deg. C. |
|---|---|---|---|---|---|---|---|---|---|---|
| Phy 1 | 0.65 | 0 | 3 | 6.6 | 3 | 6.4 | 0.645 | 15.3062544 | 3 | 102.3667904 |
| Phy 2 | 0.94 | 0 | 6 | 6.1 | 6 | 9.6 | 0.795 | 14.3733093 | 3 | 102.7683538 |
| Balti | 1.8 | 0 | 12 | 6.6 | 3 | 9.3 | 1.37 | 7.36 | 6.8 | 109.3618172 |
| Phy 3 | 2.07 | 0 | 15 | 6.6 | 3 | 10.1 | 1.935 | 11.8649673 | 3 | 95.7186162 |
| Phy 4 | 1.95 | 0 | 18 | 10.03 |  | 8.5 | 2.01 | 11.8479276 | 3 | 94.02972099 |

TABLE 3

| Device Downstream | Velocity m/s | External Ambient deg. C. | Power Upstream W | Flow Area $cm^2$ | Maximum Power W | Air Temperature deg. C. | Interpolate Velocity m/s | thetaJA deg. C./W | Maximum Power W | Juction Temperature deg. C. |
|---|---|---|---|---|---|---|---|---|---|---|
| Phy 1 | 0.066 | 0 | 3 | 27 | 3 | 15.5 | 0.066 | 21.0847333 | 3 | 128.7772286 |
| Phy 2 | 0.122 | 0 | 6 | 27 | 6 | 16.8 | 0.094 | 20.713887 | 3 | 128.9370692 |
| Balti | 0.25 | 0 | 12 | 27 | 3 | 16.4 | 0.186 | 9.728 | 6.8 | 132.5427182 |

TABLE 3-continued

| Device Downstream | Velocity m/s | External Ambient deg C. | Power Upstream W | Flow Area cm² | Maximum Power W | Air Temperature deg C. | Interpolate Velocity m/s | thetaJA deg C./W | Maximum Power W | Juction Temperature deg C. |
|---|---|---|---|---|---|---|---|---|---|---|
| Phy 3 | 0.232 | 0 | 15 | 27 | 3 | 22.1 | 0.241 | 18.9307107 | 3 | 128.872302 |
| Phy 4 | 0.365 | 0 | 18 | 27 |   | 16.3 | 0.2985 | 18.3050786 | 3 | 121.7566585 |

TABLE 4

| Device Downstream | Velocity m/s | External Ambient deg C. | Power Upstream W | Flow Area cm² | Maximum Power W | Air Temperature deg C. | Total Number of fans | Interpolate Velocity m/s | thetaJA deg C./W | Maximum Power W | Junction Temperature deg C. |
|---|---|---|---|---|---|---|---|---|---|---|---|
|  | 0.462 | 0 | 0 | 27 | 3 | 0.0 |  |  |  |  |  |
| Phy 1 | 0.462 | 0 | 3 | 27 | 3 | 2.2 | 14 | 0.462 | 16.7324209 | 3 | 102.4148382 |
| Phy 2 | 0.61 | 0 | 6 | 27 | 6 | 3.4 | 10 | 0.536 | 16.1153198 | 3 | 101.705041 |
| Balti | 1.5 | 0 | 12 | 27 | 3 | 2.7 | 12 | 1.055 | 7.99 | 6.8 | 107.064053 |
| Phy 3 | 0.696 | 0 | 15 | 27 | 3 | 7.4 | 6 | 1.098 | 13.0419854 | 3 | 96.48601298 |
| Phy 4 | 1.2775 | 0 | 18 | 27 |   | 4.8 | 7 | 0.98675 | 13.4527843 | 3 | 95.17018809 |

EXAMPLE 2

The arrangement used in Example 1, Test 1, and shown in FIG. 12, was used to measure the amount of cooling of various items of equipment. Where the equipment to be tested was a discrete chip, it was arranged under the raised portion 12 of the duct 2. Where the equipment comprised a circuit board, it was arranged in duct 3. The fan 132 (connected to duct 2) had a nominal flow rate of 0.002 m³/s. The Plugin fan 133 (connected to duct 3) had a nominal flow rate of 0.0021 m³/s.

The results shown in Table 5 are for simulated tests but the tests could be performed as described above for Example 1. The measurement of the flow velocity and the local temperature allowed the junction temperature of the equipment to be estimated. The results for the various equipment are shown in Table 5. It will be seen that in each case the junction temperature of the equipment is less than 110° C. and therefore can be considered to be acceptable.

cooled. The conductive member 151 has a flexible foot 152 for contact with an item of electrical equipment 153.

Where the conductive member comprised aluminium, an improvement of 20° C. of cooling was achieved compared with an arrangement in which no conductive member was present. Where the conductive member comprised polypropylene (PP) loaded with 60% by weight of iron filings, the improvement was 7° C. However, when the conductive member comprised PP having no filler the cooling was worse by 4° C.

Calculation of Estimated Junction Temperature of Equipment

The following theory has allowed for the estimated calculation of air temperatures (local air temperatures), the temperature generated by the working silicon of the electrical component and, thus, junction temperature of the equipment.

From a knowledge of the sectional area of the duct at a particular position (for example in the region of an item of equipment), the average temperature at that equipment can

TABLE 5

| Device | Velocity m/s | thetaJA deg C./W | External Ambient deg C. | Power Upstream W | Flow Area cm² | Internal Ambient deg C. | Maximum Power W | Junction Temperature deg C. |
|---|---|---|---|---|---|---|---|---|
| Phy 1 | 0.88 | 13.929909 | 50 | 0 | 8 | 50.0 | 3 | 91.8 |
| Phy 2 | 1 | 13.3994 | 50 | 3 | 6.6 | 54.2 | 3 | 94.4 |
| Balti | 1.65 | 6.8 | 50 | 6 | 6.1 | 55.5 | 6.8 | 101.7 |
| Phy 3 | 1.97 | 11.85654 | 50 | 12.8 | 6.6 | 59.1 | 3 | 94.6 |
| Phy 4 | 1.9 | 11.874522 | 50 | 15.8 | 6.6 | 61.6 | 3 | 97.2 |
| Zepplin | 1.15 | 37.655 | 50 | 18.8 | 10.03 | 65.0 | 0.65 | 89.5 |
| Cascade Naan | 0.4 | 21.515748 | 50 | 0 | 35 | 50.0 | 2 | 93.0 |
| Gigcard Naan | 0.84 | 20.433071 | 50 | 2 | 9 | 52.4 | 1 | 72.9 |
| Bcom Gig Phy | 0.94 | 10.322756 | 50 | 3 | 9 | 53.3 | 4.6 | 100.8 |
| L1 Gig Phy | 0.94 | 16.849666 | 50 | 3 | 9 | 53.3 | 3 | 103.8 |
| NSC 840a | 0.82 | 30.734646 | 50 | 7.6 | 9 | 59.5 | 1.58 | 108.1 |
| Zaphod | 0.78 | 11.91 | 50 | 9.18 | 7 | 65.5 | 3 | 101.2 |

EXAMPLE 3

Figure 15A:
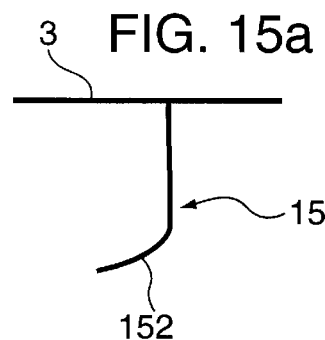
FIGS. 15a and 15b show a conductive member according to an aspect of the invention.
Figure 15B:
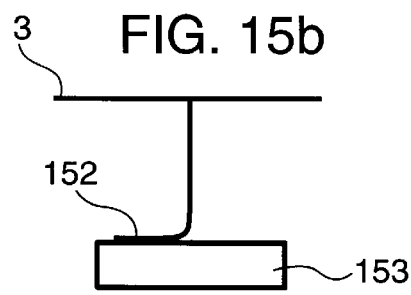

FIGS. 15a and 15b show a conductive member 151 attached to the duct 3. The member 151 may be connected directly to the roof 4 of the duct at the equipment to be be determined. From knowledge of the flow velocity in the duct, the flow velocity at the centre of the component can be interpolated ("interpolate velocity").

From a consideration of the power of the component under consideration as well as the power of components upstream of the component, the local temperature at the component can be determined.

For example, for a model having the component of interest downstream from two components having a power of 0.3 W and 2.3 W respectively.

$$0.3\ W + 2.3\ W = mC_p(\Delta T)$$

Where $m = \rho v A$;

$\Delta T = T_{LOCAL} - T_{IN}$

Thus $2.6\ w = mC_p(T_{LOCAL} - T_{IN})$ $$T_{LOCAL} = (2.6\ w)/(mC_p) + T_{IN}$$

Where $C_p$ is the specific heat capacity of air (or other fluid in the duct);

m is the mass flow rate of air in the duct;

$\rho$ is the density of air;

v is the velocity of air in the duct (interpolated local velocity); and

A is the local cross sectional area of the duct.

To estimate the junction temperature of the device, the manufacturer's data for the component is used to calculate the temperature rise of the component ($T_{RISE}$)

$$T_{RISE} = [\theta_{JA} \times PD_0]$$

Where $\theta_{JA}$ is the thermal resistance of the component (°C/W)

The junction temperature of the component can therefore be estimated $$T_{JUNCTION} = T_{LOCAL} - T_{RISE}.$$

It will be understood that the present invention has been described above purely by way of example, and modifications of detail can be made within the scope of the invention.

The Applicant asserts design right and/or copyright in the accompanying drawings.

What is claimed is:

1. A cooling apparatus for cooling electrical equipment using a fan, the cooling apparatus comprising a duct for communication with the fan and for transporting air past the electrical equipment, the duct comprising:
   a central portion having an inlet and an outlet,
   a diffuser portion having a diffuser inlet, the diffuser inlet being located at the outlet of the central portion,
   wherein an interior surface of the central portion of the duct comprises a raised portion to increase flow velocity of the air in the region of the raised portion and further comprises a by-pass in the region of the raised portion, and
   a formation, substantially perpendicular to the direction of airflow in the duct, for attaching the electrical equipment to the duct.

2. The apparatus according to claim 1, wherein the raised portion extends across less than a width of the duct at the raised portion.

3. The apparatus according to claim 1, wherein the flow velocity of the air varies along the duct.

4. The apparatus according to claim 1, wherein the sectional area of the duct varies along the duct.

5. The apparatus according to claim 1, wherein the duct comprises means for generating turbulent flow of the air in the duct.

6. The apparatus according to claim 1 wherein the formation comprises a slot.

7. A device comprising:
   a fan; and
   a cooling apparatus for cooling electrical equipment using the fan, the cooling apparatus comprising a duct for communication with the fan and for transporting air past the electrical equipment, the duct comprising:
     a central portion having an inlet and an outlet,
     a diffuser portion having a diffuser inlet, the diffuser inlet being located at the outlet of the central portion, and
     a formation, substantially perpendicular to the direction of airflow in the duct, for attaching the electrical equipment to the duct
     wherein an interior surface of the central portion of the duct comprises a raised portion to increase flow velocity of the air in the region of the raised portion and further comprises a by-pass in the region of the raised portion, and
   wherein the fan generates the flow of the air in the duct.

8. The device according to claim 7, wherein the fan generates the flow of the air by sucking the air through the duct.

9. The device according to claim 7, further comprising a power supply unit, wherein the fan is arranged to generate a flow of the air past the power supply unit.

10. The device according to claim 7, wherein the duct is arranged such that the flow of the air is faster adjacent the electrical equipment than adjacent the fan.

11. The device according to claim 7, wherein the central portion of the duct is remote from the fan.

12. The device according to claim 7, wherein the formation comprises a slot.

13. The apparatus according to claim 1, wherein the duct comprises a conductive member for conducting heat from the electrical equipment to a wall of the duct.

14. The apparatus according to claim 13, wherein the conductive member comprises conductive plastics material.

15. The apparatus according to claim 13, wherein the conductive member comprises a thermally conductive coating.

16. The apparatus according to claim 13, wherein the conductive member comprises a resilient foot.

17. The apparatus according to claim 1, wherein the duct comprises an electromagnetic shield.

18. The apparatus according to claim 1, wherein the duct comprises conductive plastic.

19. The device according to claim 7, wherein the duct comprises a conductive member for conducting heat from the electrical equipment to a wall of the duct.

20. The device according to claim 19, wherein the conductive member comprises conductive plastics material.

21. The device according to claim 19, wherein the conductive member comprises a thermally conductive coating.

22. The device according to claim 19, wherein the conductive member comprises a resilient foot.

23. The device according to claim 7, wherein the duct comprises an electromagnetic shield.

24. The device according to claim 7, wherein the duct comprises conductive plastic.

* * * * *